United States Patent
Baek et al.

(10) Patent No.: US 9,277,146 B2
(45) Date of Patent: Mar. 1, 2016

(54) IMAGE SENSOR, METHOD OF OPERATING THE SAME, AND SYSTEM INCLUDING THE IMAGE SENSOR

(71) Applicant: Samsung Electronics Co., Ltd., Suwon-Si, Gyeonggi-Do (KR)

(72) Inventors: Byung-Joon Baek, Goyang-si (KR); Young-Jin Kim, Seoul (KR); Tae Chan Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 18 days.

(21) Appl. No.: 14/452,051

(22) Filed: Aug. 5, 2014

(65) Prior Publication Data

US 2015/0042855 A1 Feb. 12, 2015

(30) Foreign Application Priority Data

Aug. 12, 2013 (KR) .................. 10-2013-0095161

(51) Int. Cl.
*H04N 5/353* (2011.01)
*H04N 5/374* (2011.01)
*H04N 9/04* (2006.01)
*H01L 27/146* (2006.01)
*H04N 5/14* (2006.01)

(52) U.S. Cl.
CPC .......... *H04N 5/3535* (2013.01); *H01L 27/1464* (2013.01); *H01L 27/14621* (2013.01); *H01L 27/14625* (2013.01); *H01L 27/14627* (2013.01); *H01L 27/14665* (2013.01); *H04N 5/374* (2013.01); *H04N 9/045* (2013.01); *H04N 5/144* (2013.01)

(58) Field of Classification Search
CPC .. H04N 5/335; H04N 5/3559; H04N 5/23293
See application file for complete search history.

(56) References Cited

U.S. PATENT DOCUMENTS

| | | | |
|---|---|---|---|
| 7,432,554 B2 * | 10/2008 | Kim | ...................... H01L 21/84 257/204 |
| 7,554,067 B2 | 6/2009 | Zarnowski et al. | |
| 8,035,708 B2 | 10/2011 | Takizawa et al. | |
| 8,054,355 B2 | 11/2011 | McCarten et al. | |
| 8,952,312 B2 * | 2/2015 | Blanquart | ......... H01L 27/14601 250/208.1 |
| 2009/0001427 A1 * | 1/2009 | Adkisson | .......... H01L 27/14609 257/229 |
| 2010/0026865 A1 | 2/2010 | Tivarus et al. | |
| 2011/0204461 A1 | 8/2011 | Lee | |

FOREIGN PATENT DOCUMENTS

| | | |
|---|---|---|
| JP | 2001203937 A | 7/2001 |
| JP | 2007228460 A | 9/2007 |

(Continued)

*Primary Examiner* — Tuan Ho
(74) *Attorney, Agent, or Firm* — Harness, Dickey & Pierce, P.L.C.

(57) ABSTRACT

An image sensor includes a pixel array having a plurality of layers and a control unit. Each of the plurality of layers including pixels having a photoelectric conversion element and a transmission transistor therein. The photoelectric conversion element is configured to collect charges during an associated charge collection time period and the transmission transistor is configured to transmit the charges to a respective floating diffusion node at an end of the charge collection time period. The control unit configured to individually instruct the transmission transistors associated with different ones of the layers to transmit the charges to the respective floating diffusion nodes such that the charge collection time periods associated with the photoelectric conversion elements implemented in at least two of the layers differs in length.

20 Claims, 15 Drawing Sheets

(56) References Cited

FOREIGN PATENT DOCUMENTS

| JP | 2010135700 | A | 6/2010 |
| JP | 2010283787 | A | 12/2010 |
| KR | 20090084134 | A | 8/2009 |

* cited by examiner

IMAGE SENSOR, METHOD OF OPERATING THE SAME, AND SYSTEM INCLUDING THE IMAGE SENSOR

CROSS-REFERENCE TO RELATED APPLICATIONS

This application claims priority under 35 U.S.C. §119(a) from Korean Patent Application No. 10-2013-0095161 filed on Aug. 12, 2013, the disclosure of which is hereby incorporated by reference in its entirety.

BACKGROUND

Example embodiments relate to an image sensor, a method of operating the image sensor, and a system including the image sensor.

Image sensors convert an optical image into an electric signal. Recently, with developments in the computer industry and the communication industry, a demand for upgraded image sensors is increasing in various fields such as digital cameras, camcorders, personal communication systems (PCSs), game consoles, security cameras, medical microcameras, and robots. With the increase in the demand for such image sensors, a multi-layer image sensor including multiple layers is being developed as a next generation image sensor in order to obtain more pixel information, for example, more color information.

SUMMARY

At least one example embodiment relates to an image sensor.

According to an example embodiment of the inventive concepts, the image sensor includes a plurality of transmission transistors and a control unit. The plurality of transmission transistors each associated with one of a plurality of stacked pixel layers, the transmission transistors configured to transmit charges to respective floating diffusion nodes during respective charge transmission operations, the charges being generated during respective charge collection time periods by photoelectric conversion elements implemented in corresponding ones of the plurality of stacked pixel layers. The control unit configured to individually control the charge transmission operations of the transmission transistors associated with each of the plurality of stacked pixel layers such that the photoelectric conversion elements implemented in different ones of the plurality of stacked pixel layers may have different charge collection time periods.

In at least one embodiment, each of the plurality of stacked pixel layers may include a transmission control line configured to propagate a transmission control signal, the transmission control signal configured to control the charge transmission operation of the transmission transistors in a respective pixel layer among the plurality of stacked pixel layers.

In at least one embodiment, the charge collection time period of the photoelectric conversion elements implemented in the plurality of stacked pixel layers is different based on relative positions of the plurality of stacked pixel layers.

In at least one embodiment, at least one of the plurality of stacked pixel layers may include a pixel configured to obtain object information of an object and the control unit is configured to analyze the object information and differently control the charge transmission operations of the transmission transistors in the plurality of stacked pixel layers according to a result of the analysis.

In at least one embodiment, the object information may include information about a movement of the object. When a value of the movement is smaller than a threshold value, the control unit may differently control the respective charge transmission operations of the transmission transistors respectively implemented in the plurality of stacked pixel layers.

In at least one embodiment, the object information may include information about a distance between the object and the image sensor. When a change of the distance is smaller than a threshold value, the control unit may differently control the respective charge transmission operations of the transmission transistors respectively implemented in the plurality of stacked pixel layers.

At least one of the plurality of stacked pixel layers may include a pixel for obtaining image information of an object, and the control unit may analyze the image information and differently control the respective charge transmission operations of the transmission transistors respectively implemented in the plurality of stacked pixel layers according to a result of the analysis.

The image information may include information about a change between frames. When the change between frames is smaller than a threshold value, the control unit may differently control the respective charge transmission operations of the transmission transistors respectively implemented in the plurality of stacked pixel layers.

The image information may include information about a motion vector of an image of the object. When a value of the motion vector is smaller than a threshold value, the control unit may differently control the respective charge transmission operations of the transmission transistors respectively implemented in the plurality of stacked pixel layers.

According to another aspect of the inventive concept, there is provided an image processing system including the above-described image sensor and a processor for controlling the image sensor.

The image processing system may further include at least one sensor that senses an object and outputs object information of the object to the control unit. The processor may process an image of the object and output image information of a processed image to the control unit. The control unit may analyze at least one of the object information and the image information and differently control the respective charge transmission operations of the transmission transistors respectively implemented in the plurality of stacked pixel layers according to a result of the analysis.

According to another example embodiment of the inventive concepts, there is provided a portable electric device including the above-described image sensor, a processor that controls the image sensor, and a display unit that displays an image based on an output signal of the processor.

According to another example embodiment of the inventive concepts, there is provided a method of operating an image sensor including a pixel array having a plurality of stacked pixel layers.

In one example embodiment, the method includes analyzing information of an object the information being generated by the pixel array, and individually controlling transmission transistors associated with respective ones of the plurality of stacked pixel layers according to a result of the analysis such that the photoelectric conversion elements implemented in different ones of the plurality of stacked pixel layers may have different charge collection time periods.

Each of the pixel layers may include a transmission control line via which a transmission control signal for controlling the charge transmission operation of the transmission transistor is received. The respective charge transmission collection time periods of the photoelectric conversion elements respectively implemented in the plurality of stacked pixel layers may be different according to the positions of the plurality of stacked pixel layers.

At least one example embodiment relates to an image sensor.

In at least one embodiment, the image sensor includes a pixel array having a plurality of layers, each of the plurality of layers including pixels having a photoelectric conversion element and a transmission transistor therein, the photoelectric conversion element configured to collect charges during an associated charge collection time period and the transmission transistor configured to transmit the charges to a respective floating diffusion node at an end of the charge collection time period; and a control unit configured to individually instruct the transmission transistors associated with different ones of the layers to transmit the charges to the respective floating diffusion nodes such that the charge collection time periods associated with the photoelectric conversion elements implemented in at least two of the layers differs in length.

In at least one embodiment, the control unit is configured to adjust the charge collection time period of the photoelectric conversion elements of the pixels in the layers based on a position of the layer associated with the pixels in relation to other ones of the layers.

In at least one embodiment, each of the pixels is configured to output a pixel signal, and the control unit is configured to adjust the charge collection time period of the photoelectric conversion elements of the pixels in the layers based on an attenuation in the pixel signals due to stacking of the layers.

In at least one embodiment, each of the layers include a transmission control line configured to propagate a transmission control signal to the transmission transistors associated with the layer such that the associated transmission transistor transmit the charges to the respective floating diffusion node based on the transmission control signal.

In at least one embodiment the image sensor is configured to sense an object, and the control unit is configured to adjust the charge collection time period if one or more of an amount of movement of the object and a distance between the object and the image sensor is greater than a threshold.

BRIEF DESCRIPTION OF THE DRAWINGS

These and/or other aspects and advantages of the inventive concepts will become apparent and more readily appreciated from the following description of the example embodiments, taken in conjunction with the accompanying drawings of which.

DETAILED DESCRIPTION OF THE EMBODIMENTS

Figure 1:
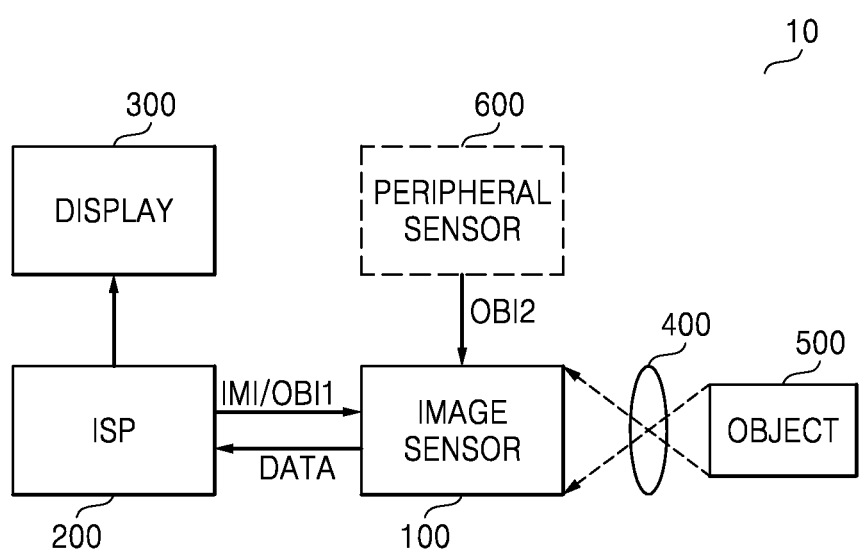
FIG. 1 is a block diagram of an image processing system according to an example embodiment of the inventive concepts.

Some example embodiments of the inventive concepts now will be described more fully hereinafter with reference to the accompanying drawings, in which embodiments of the invention are shown. The example embodiments may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein FIG. 1 is a block diagram of an image processing system 10 according to an example embodiment of the inventive concepts.

Referring to FIG. 1, the image processing system 10 may include an image sensor 100, an image signal processor (ISP) 200, and a display 300.

In one example embodiment, the image sensor 100 and the ISP 200 may be implemented by using a printed circuit board (PCB) such as a motherboard, an integrated circuit (IC), or a system on chip (SoC). Alternatively, in another example embodiment, the image sensor 100 and the ISP 200 may be implemented by using a multi-chip package (MCP) or a system in package (SiP).

The image processing system 10 may be used in a digital camera or a portable electronic device including a digital camera. The image processing system 10 may sense an object 500 or an image of the object 500 that is received via a lens 400, under the control of the ISP 200. The image processing system 10 may further include at least one peripheral sensor 600 that directly generates object information OBI2 of the object 500.

According to an example embodiment, the peripheral sensor 600 may be a depth sensor capable of generating depth information of the object 500. For example, the depth sensor may include a time of flight (TOF) sensor. Alternatively, according to another example embodiment, the peripheral sensor 600 may be a motion sensor capable of generating motion information of the object 500. For example, the motion sensor may include a dynamic vision sensor (DVS).

The image sensor 100 may sense the object 500 or the image of the object 500 received via the lens 400, generate image data DATA based on a result of the sensing, and output image data DATA to the ISP 200.

The image sensor 100 may differently control respective charge transmission operations of transmission transistors of photoelectric conversion elements respectively implemented in a plurality of stacked pixel layers, in order to differently control charge collection time periods of the photoelectric conversion elements.

According to an example embodiment, the image sensor 100 may analyse at least one of object information OBI1 and image information IMI of the object 500, which are output by the ISP 200, and may differently control the respective charge transmission operations of the transmission transistors of the photoelectric conversion elements respectively implemented in the stacked pixel layers according to a result of the analysis.

According to another example embodiment, the image sensor 100 may analyse the object information OBI2 output by the peripheral sensor 600 and may differently control the respective charge transmission operations of the transmission transistors of the photoelectric conversion elements respectively implemented in the stacked pixel layers according to a result of the analysis.

The image sensor 100 may be implemented by using a separate chip. For example, the image sensor 100 may be implemented by using a CMOS image sensor chip.

Figure 2:
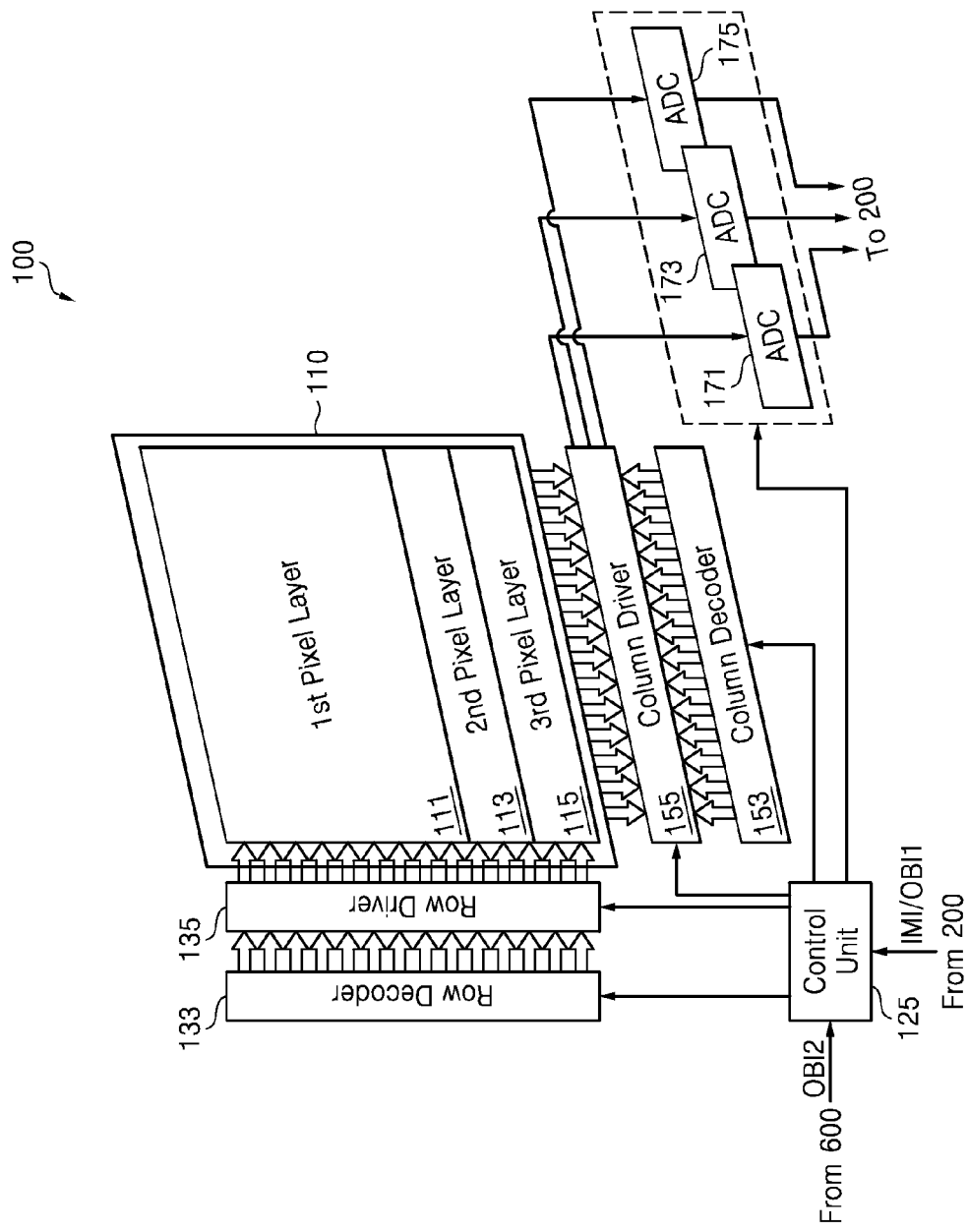
FIG. 2 is a schematic block diagram of an image sensor illustrated in FIG. 1.

FIG. 2 is a schematic block diagram of the image sensor 100 illustrated in FIG. 1.

Referring to FIGS. 1 and 2, the image sensor 100 may include a pixel array 110, a control unit 125, a row decoder 133, a row driver 135, a column decoder 153, a column driver 155, and a plurality of analog-digital converters (ADCs) 171, 173, and 175.

The pixel array 110 may sense light reflected by the object 500 and may generate the object information OBI1 of the object 500 and/or the image information IMI of the object 500. The pixel array 110 may include a plurality of pixels arranged in a two-dimensional matrix. The pixel array 110 may include a plurality of pixel layers 111, 113, and 115.

For convenience of explanation, FIG. 2 illustrates the case where the pixel array 110 includes three pixel layers 111,113 and 115, but example embodiments of the inventive concepts are not limited to the 3 pixel layers. For example, the pixel array 110 may include at least two pixel layers.

Figure 3:
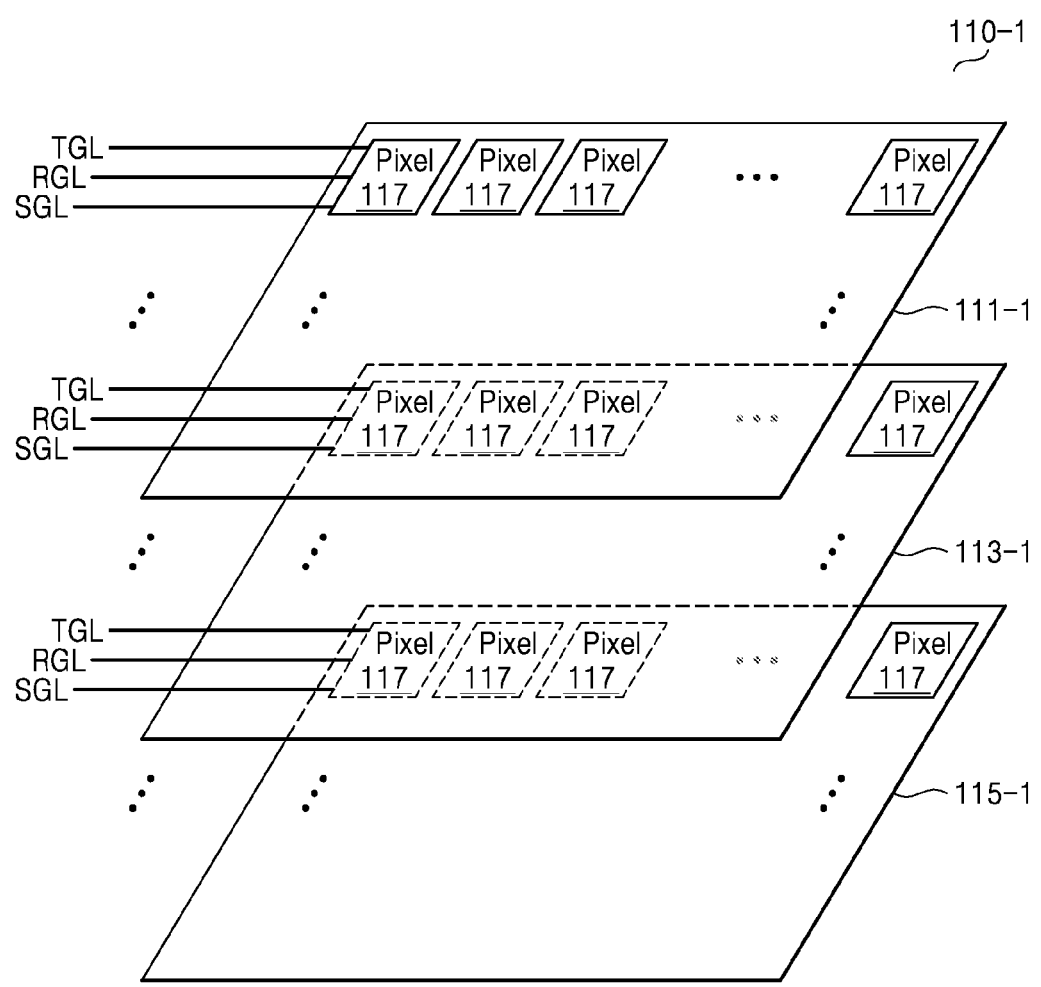
FIG. 3 illustrates a schematic structure of a pixel array illustrated in FIG. 2, according to an example embodiment of the inventive concepts.

FIG. 3 illustrates a schematic structure of a pixel array 110-1, which is an embodiment of the pixel array 110 illustrated in FIG. 2. The pixel layers 111, 113, and 115 illustrated in FIG. 2 may be implemented by using a plurality of stacked pixel layers 111-1, 113-1, and 115-1 illustrated in FIG. 3, respectively.

At least one of the stacked pixel layers 111-1, 113-1, and 115-1 may sense light reflected by the object 500 and may generate the image information IMI of the object 500. Each of the stacked pixel layers 111-1, 113-1, and 115-1 may include a plurality of pixels 117 and a plurality of control lines, namely, a transmission control line TGL, a reset control line RGL, and a selection control line SGL.

Each pixel 117 may sense light reflected by the object 500 and may generate the image information IMI of the object 500.

Each pixel 117 may be a color pixel capable of generating the image information IMI of the object 500. For example, the color pixel may be a red pixel that converts light in a red spectrum into an electric signal, a green pixel that converts light in a green spectrum into an electric signal, or a blue pixel that converts light in a blue spectrum into an electric signal. The color pixel may also be a white pixel, a cyan pixel, a yellow pixel, or a magenta pixel.

Figure 4:
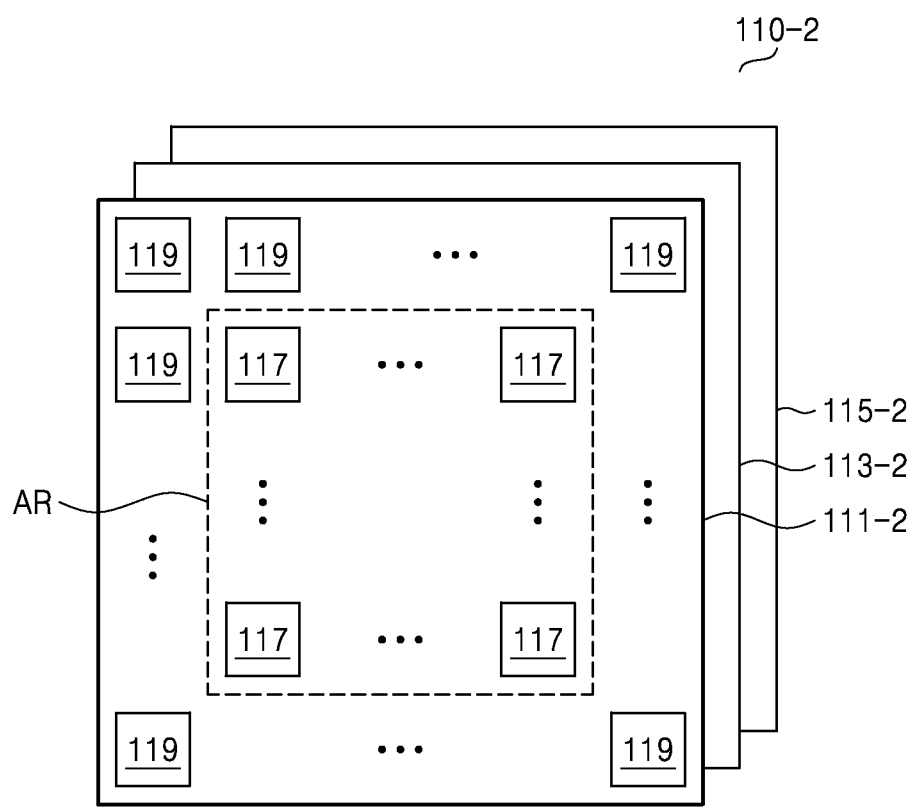
FIG. 4 illustrates a schematic structure of the pixel array illustrated in FIG. 2, according to another example embodiment of the inventive concepts.

FIG. 4 illustrates a schematic structure of a pixel array 110-2, which is another example embodiment of the pixel array 110 illustrated in FIG. 2.

Referring to FIGS. 1 and 4, the pixel array 110-2 may include a plurality of stacked pixel layers 111-2, 113-2, and 115-2.

At least one of the stacked pixel layers 111-2, 113-2, and 115-2 may sense light reflected by the object 500 and may generate the object information OBI1 and image information IMI of the object 500.

At least one of the stacked pixel layers 111-2, 113-2, and 115-2 may include the pixels 117 and a plurality of different pixels 119. According to an example embodiment, each of the different pixels 119 may be a depth pixel or motion sensor pixel capable of generating the object information OBI1 of the object 500. The different pixel 119 may be implemented in a range other than an active range AR of the pixel array 111-2, in which the pixels 117 are implemented. Alternatively, the different pixels 119 may be implemented in a part of the active range AR.

FIG. 4 illustrates the case where the active range AR is all but the outermost area of the pixel array 111-2, but example embodiments of the inventive concepts are not limited thereto.

Figure 5:
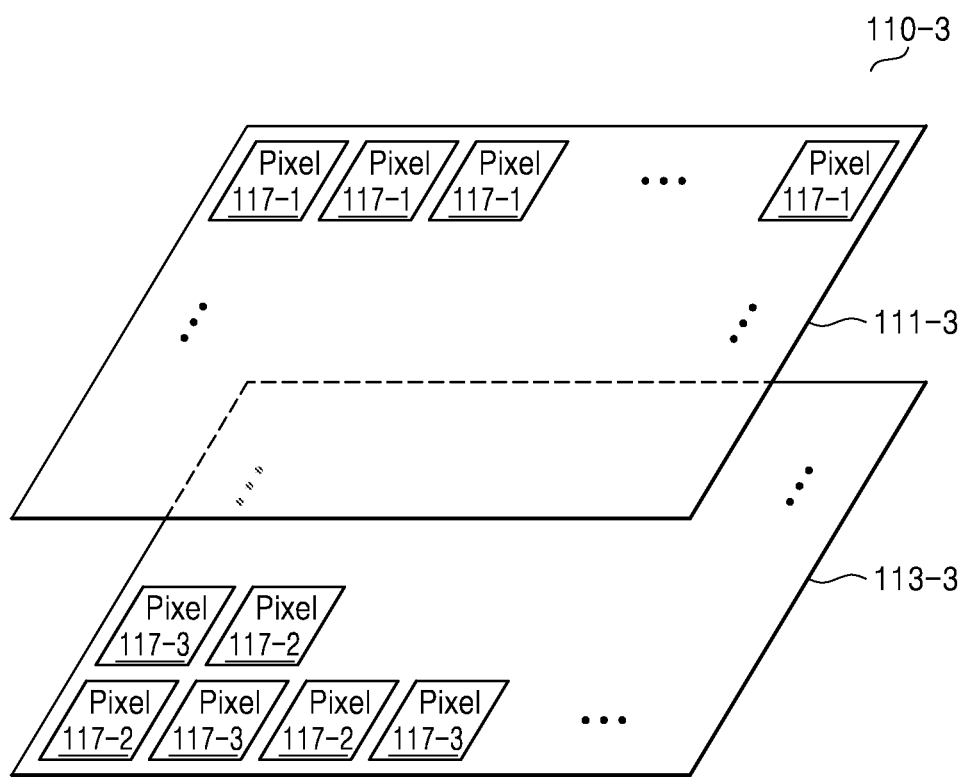
FIG. 5 is a schematic structure of the pixel array illustrated in FIG. 2, according to another example embodiment of the inventive concepts.

FIG. 5 illustrates a schematic structure of a pixel array 110-3, which is another example embodiment of the pixel array 110 illustrated in FIG. 2.

Referring to FIGS. 1 and 5, the pixel array 110-3 may include a plurality of stacked pixel layers 111-3 and 113-3.

The pixel layer 111-3 may be formed of an organic photo-electric-conversion film. The pixel layer 111-3 may include a plurality of pixels 117-1. For example, each pixel 117-1 may be a green pixel.

The pixel layer 113-3 may include pixels 117-2 and pixels 117-3. The pixels 117-2 and 117-3 may be arranged in a checker pattern. The checker pattern may be such each of the pixels 117-2 are surrounded by pixels 117-3 and each of the pixels 117-3 are surrounded by pixels 117-2.

Each pixel 117-2 may be a red pixel, and each pixel 117-3 may be a blue pixel. In this case, each pixel 117-2 may include a yellow organic color filter, and each pixel 117-3 may include a cyan organic color filter.

Figure 6:
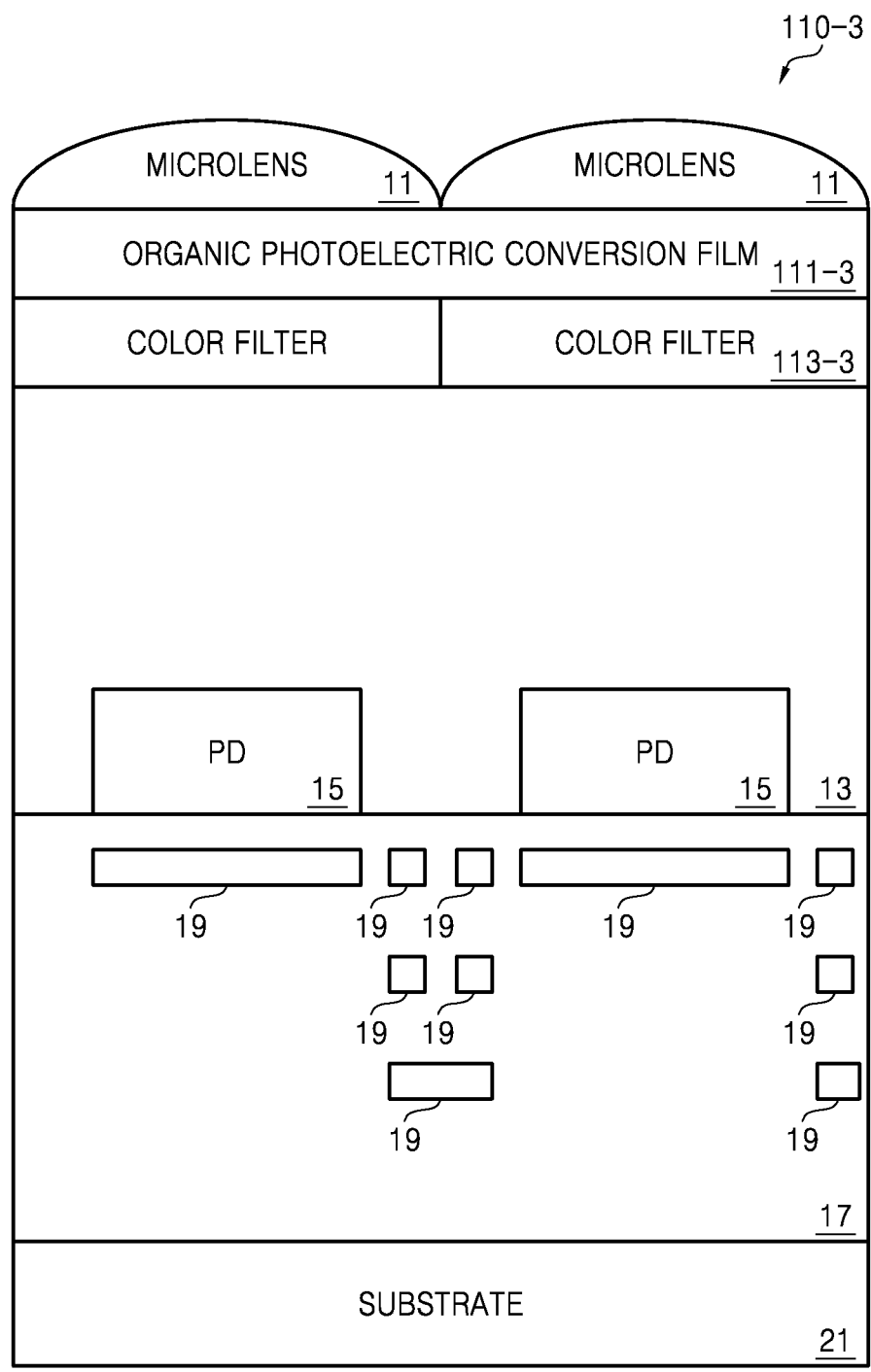
FIG. 6 is a schematic sectional view of the pixel array illustrated in FIG. 5.

FIG. 6 is a schematic sectional view of the pixel array 110-3 illustrated in FIG. 5.

Referring to FIG. 6, the pixel array 110-3 may further include a microlens 11, an epitaxial layer 13, a dielectric layer 17, and a substrate 21.

A photo detector (PD) 15 may generate photons in response to externally incident light. The externally incident light may be focused by the microlens. However, the pixel array 110-3 may be implemented without the microlens 11.

The photo detector PD 15 may be formed in the epitaxial layer 13. The photo detector PD 15 is a photosensitive element, and may be implemented by a photodiode, a phototransistor, a photogate or a pinned photodiode. However, example embodiments are not limited thereto and the photo detector PD 15 may be implemented using other photosensitive elements.

The dielectric layer 17 may be an oxide layer or a composite layer of an oxide layer and a nitride layer. For example, the oxide layer may be a silicon oxide layer. The dielectric layer 17 may include metals 19.

Electrical wiring for a sensing operation of the pixel array 110-3 may be formed by the metals 19. According to an example embodiment, the metals 19 may be used to reflect light received via the PD 15 back to the PD 15.

The metals 19 may copper, titanium, or a titanium nitride and the substrate 21 may be a silicon substrate.

Figure 7:
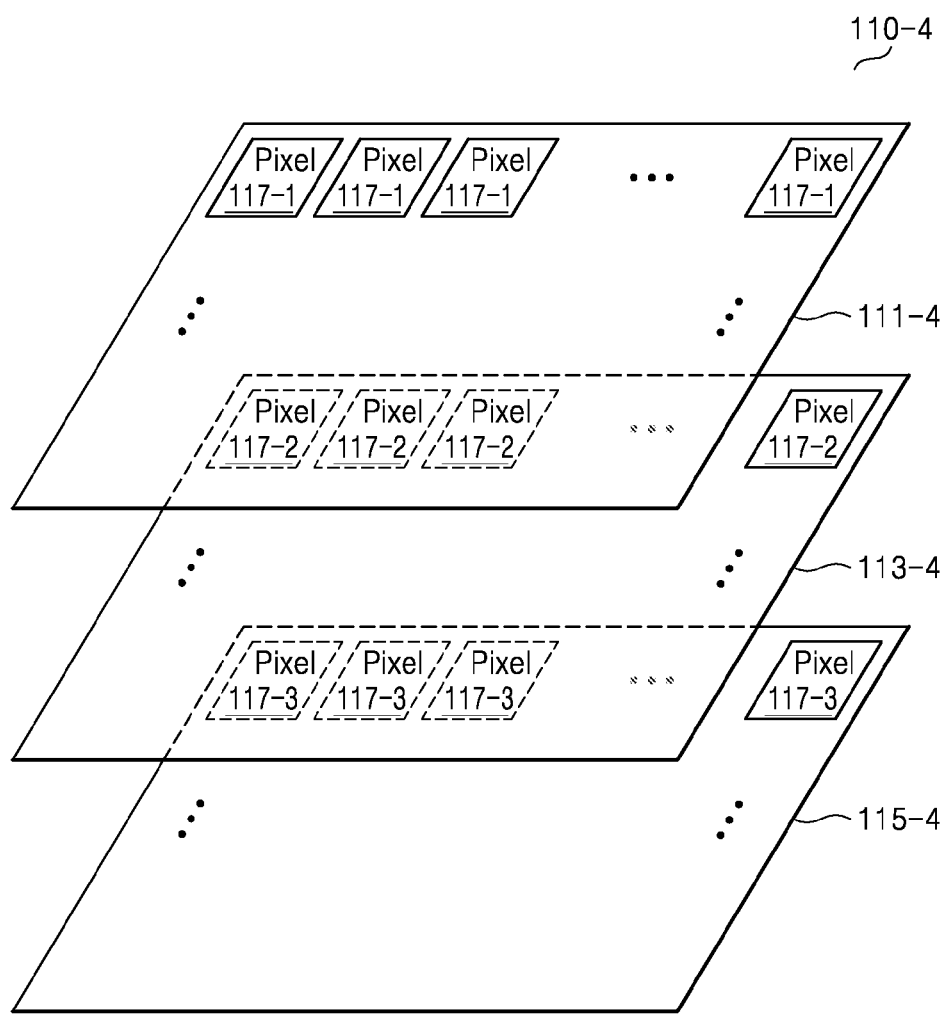
FIG. 7 illustrates a schematic structure of the pixel array illustrated in FIG. 2, according to another example embodiment of the inventive concepts.

FIG. 7 illustrates a schematic structure of a pixel array 110-4, which is another example embodiment of the pixel array 110 illustrated in FIG. 2.

Referring to FIG. 7, the pixel array 110-4 may include a plurality of stacked pixel layers 111-4, 113-4, and 115-4.

Each of the pixel layers 111-4, 113-4, and 115-4 may be formed of an organic photoelectric-conversion film.

The pixel layer 111-4 may include pixels 117-1, the pixel layer 113-4 may include pixels 117-2, and the pixel layer 115-4 may include pixels 117-3.

According to an embodiment, each pixel 117-1 may be a green pixel, each pixel 117-2 may be a blue pixel, and each pixel 117-3 may be a red pixel. In this case, each pixel 117-3 implemented in the pixel layer 115-4 may include no filters (for example, a red color filter or a yellow organic color filter).

According to another embodiment, each pixel 117-1 may be a green pixel, each pixel 117-2 may be a red pixel, and each pixel 117-3 may be a blue pixel. In this case, each pixel 117-3 implemented in the pixel layer 115-4 may include no color filters (for example, a blue color filter or a cyan organic color filter).

Figure 8:
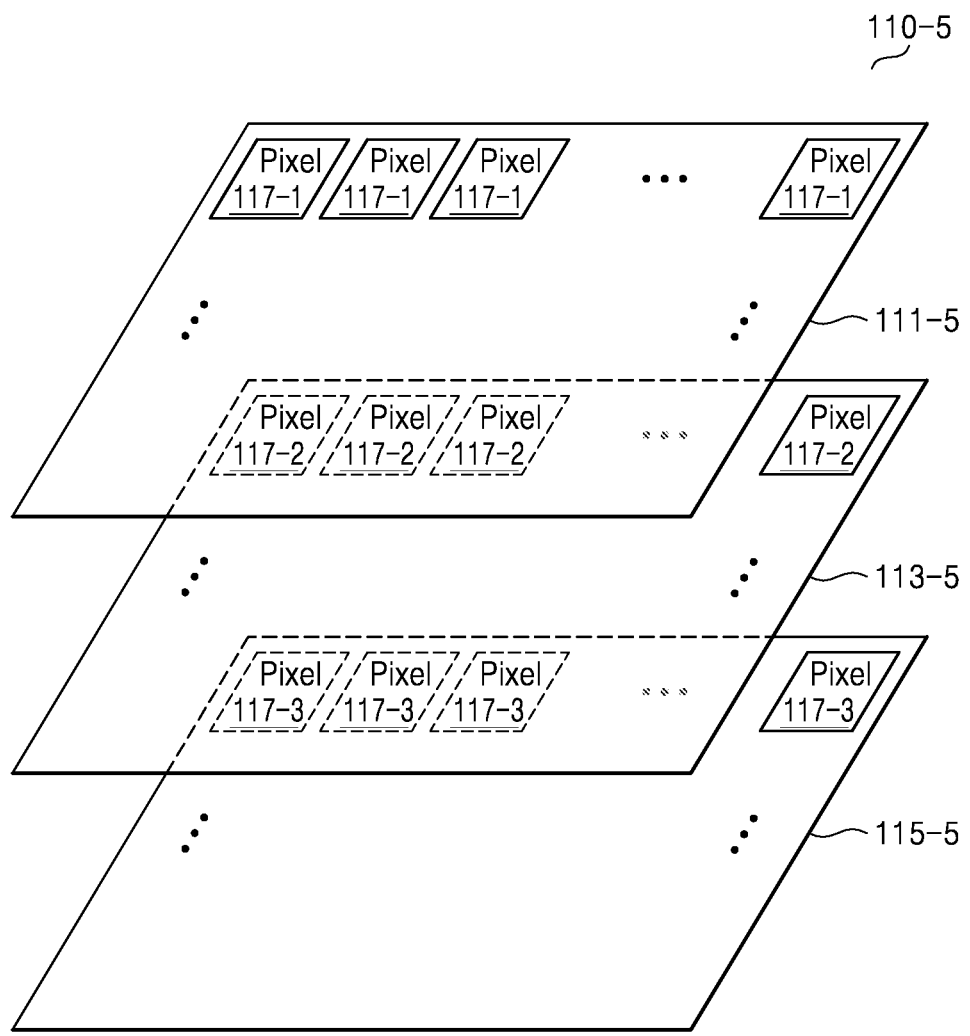
FIG. 8 illustrates a schematic structure of the pixel array illustrated in FIG. 2, according to another example embodiment of the inventive concepts.

FIG. 8 illustrates a schematic structure of a pixel array 110-5, which is another example embodiment of the pixel array 110 illustrated in FIG. 2.

Referring to FIG. 8, the pixel array 110-5 may include a plurality of stacked pixel layers 111-5, 113-5, and 115-5.

Each of the stacked pixel layers 111-5, 113-5, and 115-5 may be formed of an organic photoelectric-conversion film. Each pixel 117-1 implemented in the pixel layer 111-5 may be a blue pixel, each pixel 117-2 implemented in the pixel layer 113-5 may be a green pixel, and each pixel 117-3 implemented in the pixel layer 115-5 may be a red pixel, but example embodiments of the inventive concepts are not limited to the order of red, green, and blue pixels.

Figure 9:
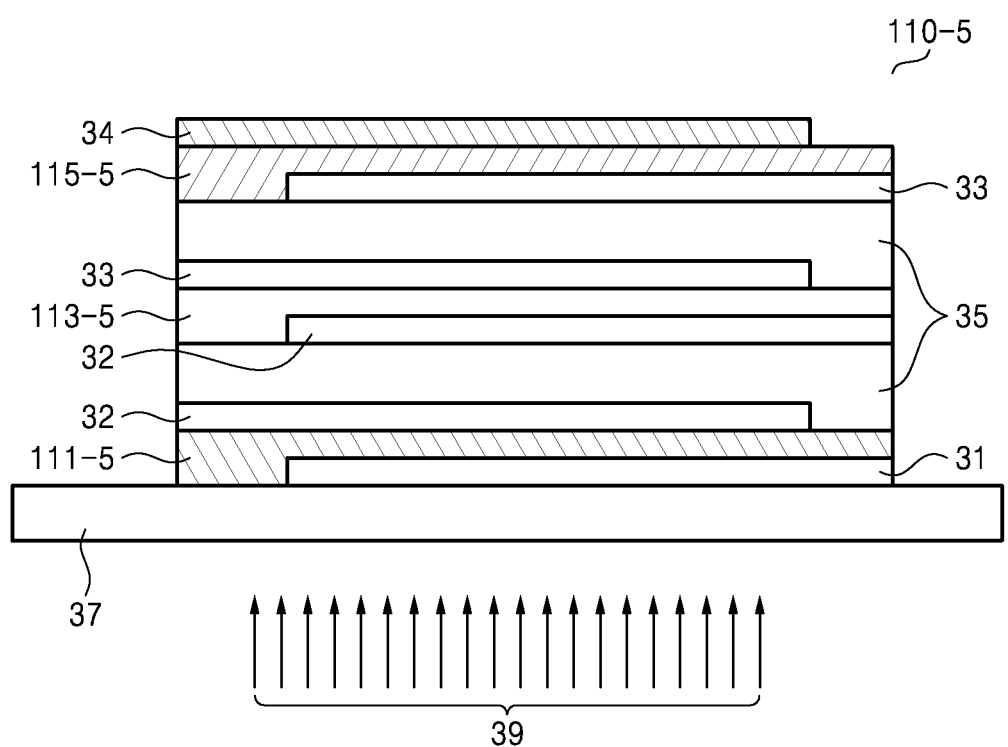
FIG. 9 is a schematic sectional view of the pixel array illustrated in FIG. 8.

FIG. 9 is a schematic sectional view of the pixel array 110-5 illustrated in FIG. 8.

Referring to FIG. 9, the pixel array 110-5 may include a plurality of electrodes 31, 32, 33, and 34, insulation layers 35, and a substrate 37.

The electrode 31 may be formed of a patterned indium tin oxide (ITO), a conducting polymer, or a semitransparent metal. The electrode 32 may be formed of a semitransparent metal. The electrode 33 may be formed of an ITO, a conducting polymer, or a semitransparent metal. The electrode 34 may be formed of a metal.

Each of the insulation layers 35 may be formed of an oxide layer or a composite layer of an oxide layer and a nitride layer. For example, the oxide layer may be a silicon oxide layer. The substrate 37 may be a transparent substrate. In other words, the substrate 37 may transmit externally-incident light 39.

Referring back to FIGS. 1 to 3, for convenience of explanation, a plurality of control lines, namely, the transmission control line TGL, the reset control line RGL, and the selection control line SGL, are only illustrated in FIG. 3. However, the pixel layers 111-1 through 111-5 (collectively, 111), the pixel layers 113-1 through 113-5 (collectively, 113), and the pixel layers 115-1 through 115-5 (collectively, 115) illustrated in FIGS. 3 through 9 may each include the control lines TGL, RGL, and SGL illustrated in FIG. 3.

The control lines, namely, the transmission control line TGL, the reset control line RGL, and the selection control line SGL, may transmit control signals to each row of pixels 117. The control lines, namely, the transmission control line TGL, the reset control line RGL, and the selection control line SGL, may be implemented in units of rows.

The transmission control line TGL may transmit to a transmission transistor a transmission control signal for controlling a charge transmission operation of the transmission transistor. The reset control line RGL may transmit to a reset transistor a reset control signal for controlling a floating diffusion node.

The selection control line SGL may transmit to a selection transistor a selection control signal for transmitting a signal (for example, a noise signal or a pixel signal) generated by the pixels 117 to a column line, namely, an output line.

In FIG. 3, the control signal lines RGL and SGL are implemented in each pixel layer. However, according to an example embodiment, the control signal lines RGL and SGL may be shared in units of rows by the pixel layers 111, 113, and 115.

Figure 10:
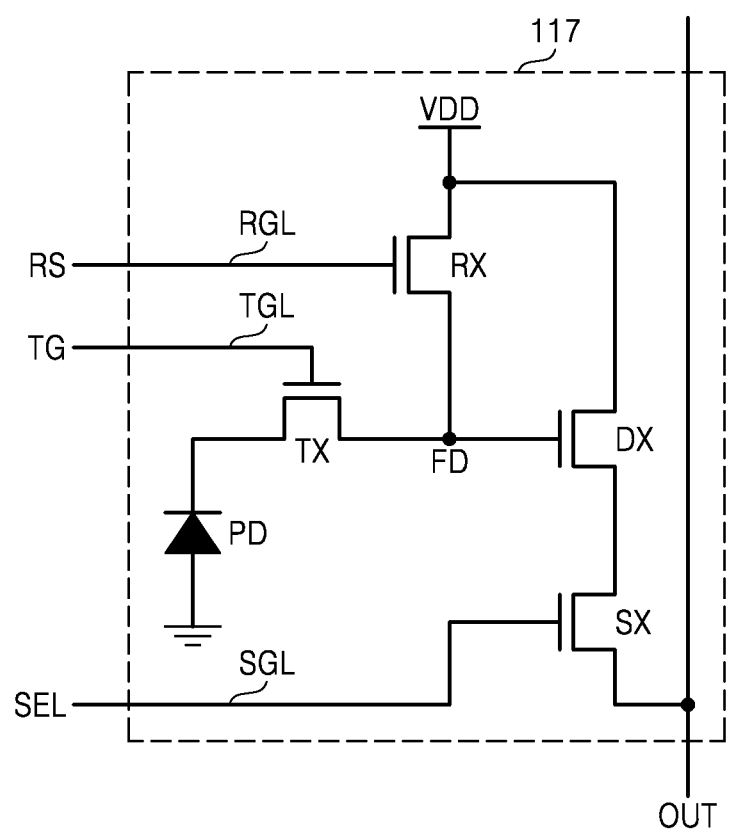
FIG. 10 is a circuit diagram of a pixel implemented in the pixel layer illustrated in FIG. 3.

FIG. 10 is a circuit diagram of a pixel 117 implemented in each pixel layer illustrated in FIG. 3. Although FIG. 10 illustrates the case where the pixel 117 has a four-transistor structure, the pixel 117 may be implemented as a three-transistor structure, a five-transistor structure, or a gate structure similar to a four-transistor structure. For convenience of explanation, FIG. 10 illustrates only one of the pixels 117 of FIG. 3.

Referring to FIGS. 1 to 3 and 10, the pixel 117 may include a photoelectric conversion element PD, a transmission transistor TX, a reset transistor RX, a selection transistor SX, and an amplification transistor DX.

The photoelectric conversion element PD may generate photo charges corresponding to light reflected by the object 500 and may accumulate the generated photo charges. The photoelectric conversion element PD may be implemented by using a photo diode, a photo transistor, a photo gate, or a pinned photo diode. The photoelectric conversion element PD may be connected with the transmission transistor TX.

The transmission transistor TX may perform charge transmission operations of transmitting the photo charges generated by a photoelectric conversion operation of the photoelectric conversion element PD to a floating diffusion node FD.

The transmission transistor TX may be controlled according to a transmission control signal TG provided to a gate of the transmission transistor TX via a transmission control line TGL. In other words, the transmission control signal TG may be a control signal for controlling a charge transmission operation of the transmission transistor TX. For example, when the transmission control signal TG is input to the transmission transistor TX, the gate of the transmission transistor TX may be turned on.

The floating diffusion node FD may accumulate the photo charges received from the photoelectric conversion element PD via the transmission transistor TX, and may generate a voltage corresponding to the accumulated photo charges. The floating diffusion node FD may be connected with a gate of the amplification transistor DX, and thus may control the amplification transistor DX.

The reset transistor RX may reset the floating diffusion node FD. The reset transistor RX may be connected between the floating diffusion node FD and a power line that supplies a driving voltage VDD. The reset transistor RX may be controlled according to a reset control signal RS that a gate of the reset transistor RX receives via a reset control line RGL. For example, when the reset transistor RX is turned on in response to the reset control signal RS, the floating diffusion node FD is reset.

The amplification transistor DX may be a common-drain amplifier which performs a source follower operation. The amplification transistor DX may output a voltage associated with the driving voltage VDD to the selection transistor SX, based on the voltage corresponding to the photo charges accumulated in the floating diffusion node FD.

The selection transistor SX may be controlled according to a selection control signal SEL that a gate of the selection transistor SX receives via a selection control line SGL. The selection transistor SX may select pixels 117 in units of columns. The selection transistor SX may output the voltage output by the amplification transistor DX to an output line OUT.

The control signal lines RGL, TGL, and SGL, which transmit the control signals RS, TG, and SEL for respectively controlling the transmission transistor TX, the reset transistor RX, and the selection transistor SX, may be extended in a row direction.

Figure 11:
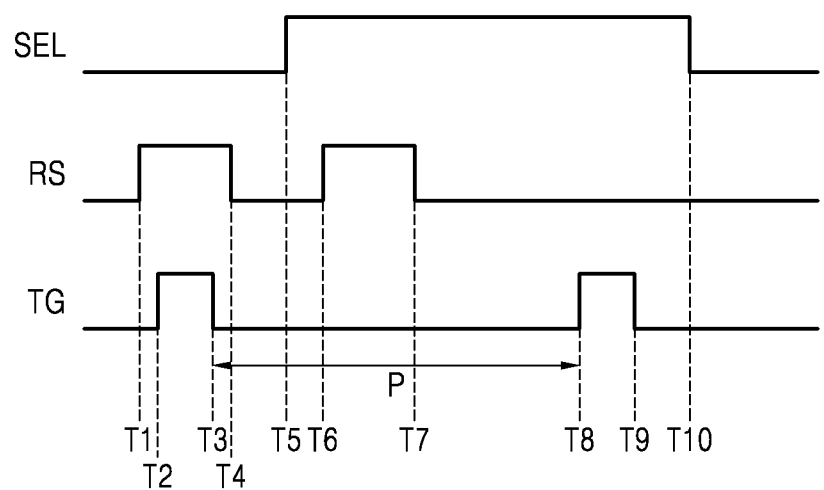
FIG. 11 is a timing diagram for describing a charge collection time period of a photo charge conversion device of the pixel illustrated in FIG. 10.

FIG. 11 is a timing diagram for describing a charge collection time period of the photoelectric conversion element PD of the pixel 117 illustrated in FIG. 10.

Referring to FIGS. 1 to 3, 10, and 11, the reset transistor RX may be turned on from a first time point T1 to a fourth time point T4 in response to the reset control signal RS.

The transmission transistor TX may be turned on from a second time point T2 to a third time point T3 in response to the transmission control signal TG. As the transmission transistor TX is turned on, photo charges generated by the photoelectric conversion element PD, for example, photons, may be transmitted to the power line supplying the driving voltage VDD via the floating diffusion node FD and the reset transistor RX.

The selection transistor SX may be turned on from a fifth time point T5 to a tenth time point T10 in response to the selection control signal SEL. As the reset transistor RX is turned on from a sixth time point T6 to a seventh time point T7 in response to the reset control signal RS, the selection transistor SX may output a signal corresponding to a voltage of the floating diffusion node FD, for example, a noise signal, to the output line OUT.

As the transmission transistor TX is turned off from the third time point T3 to an eighth time point T8, the photoelectric conversion element PD may generate photo charges corresponding to incident light from the third time point T3 to the eighth time point T8 (for example, during a charge collection time period P), and may accumulate the generated photo charges.

As the transmission transistor TX is turned on from the eighth time point T8 to a ninth time point T9 in response to the transmission control signal TG, the selection transistor SX may output a signal corresponding to the photo charges generated by the photoelectric conversion element PD, for example, a pixel signal, to the output line OUT.

The charge collection time period may denote an integration time or an exposure time.

Referring to FIG. 2, the control unit 125 may generate a control signal(s) for controlling respective operations of the row decoder 133, the row driver 135, the column decoder 153, the column driver 155, and the ADCs 171,173, and 175. For example, the control unit 125 may generate a plurality of row control signals for selecting a specific row line from among a plurality of row lines included in each of the pixel layers 111,113, and 115.

The row control signals may include the transmission control signal TG, the reset control signal RS, and the selection control signal SEL, and the like. The control unit 125 may individually control respective charge transmission operations of the transmission transistors TX implemented in each of the pixel layers 111,113, and 115. By individually controlling the charge transmission operations, the control unit may individually adjust respective charge collection time periods P of the photoelectric conversion element PD of the pixels 117 respectively implemented in the pixel layers 111,113, and 115. Therefore, each of the photoelectric conversion elements PD may have a different charge collection time period P.

By controlling the charge collection time P of each of the pixel layers 111, 113 and 115, the image sensor 100 may decrease signal attenuation that may occur due to the stacking of the pixel layers 111, 113 and 115

According to an example embodiment, the control unit 125 may analyze the object information OBI1 and/or image information IMI of the object 500 received from the ISP 200, and may differently control the respective charge transmission operations of the transmission transistors TX respectively implemented in the pixel layers 111,113, and 115 according to a result of the analysis.

In one example embodiment, the object information OBI1 may include information about a movement (or motion) of the object 500, and the control unit 125 may differently control the respective charge transmission operations of the transmission transistors TX respectively implemented in the pixel layers 111,113, and 115, when a value of the movement is less than a threshold value.

In one example embodiment, the object information OBI1 may include information about a distance between the object 500 and the image sensor 100, and the control unit 125 may differently control the respective charge transmission operations of the transmission transistors TX respectively implemented in the pixel layers 111,113, and 115, when a variation of the distance is less than a threshold value.

The image information IMI may include information about a change between frames, and the control unit 125 may differently control the respective charge transmission operations of the transmission transistors TX respectively implemented in the pixel layers 111,113, and 115, when the change between frames is less than a threshold value.

The image information IMI may include information about a motion vector of an image of the object 500, and the control unit 125 may differently control the respective charge transmission operations of the transmission transistors TX respectively implemented in the pixel layers 111,113, and 115, when a value of the motion vector is less than a threshold value.

According to another embodiment, rather than receiving the information to analyse from, the ISP 200, the control unit 125 may analyze the object information OBI2 of the object 500 received from the peripheral sensor 600, and may differently control the respective charge transmission operations of the transmission transistors TX respectively implemented in the pixel layers 111,113, and 115, according to a result of the analysis. For example, the object information OBI2 may include information about a movement of the object 500, and the control unit 125 may differently control the respective charge transmission operations of the transmission transistors TX respectively implemented in the pixel layers 111,113, and 115, when a value of the movement (or motion) is less than a threshold value.

The object information OBI2 may include information about a distance between the object 500 and the image sensor 100, and the control unit 125 may differently control the respective charge transmission operations of the transmission transistors TX respectively implemented in the pixel layers 111,113, and 115, when a variation of the distance is less than a threshold value.

The row decoder 133 may decode the row control signals output by the control unit 125, for example, row address signals, and may output a plurality of row selection signals according to a result of the decoding. The row driver 135 may drive the pixels included in at least one of a plurality of rows included in each of the pixel layers 111,113, and 115 in response to each of the row selection signals output by the row decoder 133.

The column decoder 153 may decode a plurality of column control signals output by the control unit 125, for example, column address signals, and may output a plurality of column selection signals according to a result of the decoding. The column driver 155 may drive a plurality of column lines included in each of the pixel layers 111,113, and 115 in response to the column selection signals output by the column decoder 153, respectively.

For convenience of explanation, the image sensor 100 includes the single row driver 135 and the single column driver 155. However, according to an embodiment, the image sensor 100 may include a plurality of row drivers for driving respective row lines of each of the pixel layers 111,113, and 115 and/or a plurality of column drivers for driving respective column lines of each of the pixel layers 111,113, and 115. For example, the row lines may include the transmission control line TGL, the reset control line RGL, and the selection control line SGL.

In this case, the image sensor 100 may include a plurality of row decoders and/or a plurality of column decoders.

The ADCs 171,173 and 175 may perform ADC on signals output by each of the pixel layers 111,113, and 115, respectively, and may output results of the ADC as image data DATA to the ISP 200. For example, the image data DATA may include the object information OBI1 and/or the image information IMI.

According to an embodiment, each of the ADCs 171,173, and 175 may further include a correlated double sampling (CDS) circuit (not shown) which performs CDS on the signals output by each of the pixel layers 111,113, and 115.

In this case, each of the ADCs 171,173 and 175, may compare a signal corresponding to a result of the CDS with a ramp signal, and may output a result of the comparison as the image data DATA.

The ISP 200 may generate an image by processing the image data DATA output by the image sensor 100, and may output the generated image to the display 300.

The ISP 200 may also extract the object information OBI1 and/or image information IMI of the object 500 from the image data DATA output by the image sensor 100, and may transmit the extracted object information OBI1 and/or image information IMI to the image sensor 100.

For convenience of explanation, FIG. 1 illustrates the case where the ISP 200 is implemented outside the image sensor 100, however, the ISP 200 may be implemented within the image sensor 100.

The display 300 may be any display devices capable of displaying images. For example, the display 300 may be implemented using a touch screen, a liquid crystal display (LCD), a thin film transistor-liquid crystal display (TFT-LCD), a light emitting diode (LED) display, an organic LED (OLED) display, an active matrix OLED (AMOLED) display, or a flexible display.

Figure 12:
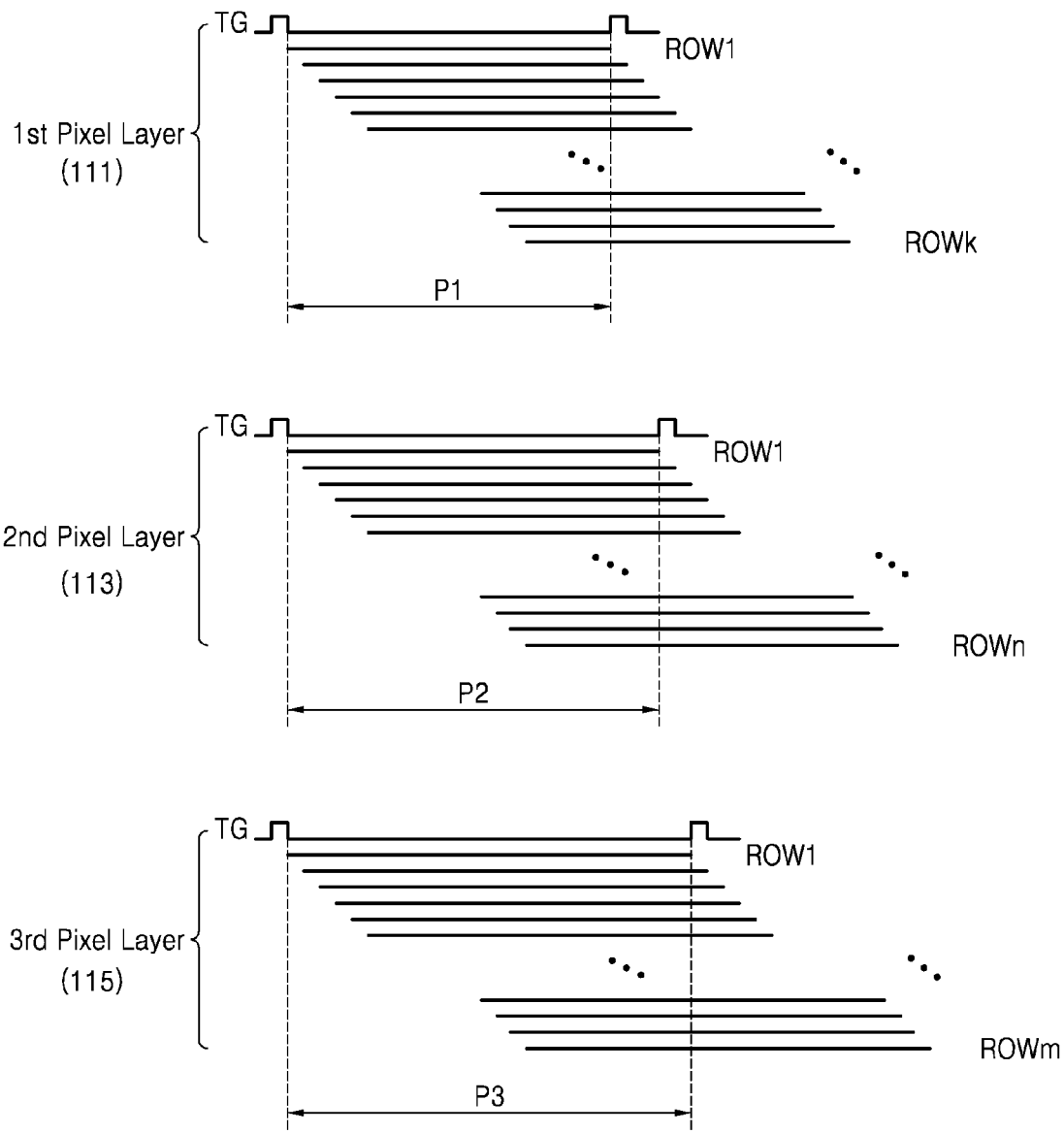
FIG. 12 is a conceptual diagram for describing a method of operating an image sensor, according to an example embodiment of the inventive concepts.

FIG. 12 is a conceptual diagram for describing a method of operating the image sensor 100 according to an example embodiment of the inventive concepts.

Referring to FIGS. 1 to 3 and 10 to 12, the control unit 125 may individually control respective charge transmission operations of the transmission transistors TX implemented in each of the pixel layers 111,113, and 115. By individually controlling the charge transmission operations, the control unit 125 may individually adjust respective charge collection time periods P of the photoelectric conversion elements PDs respectively implemented in the pixel layers 111,113, and 115. Therefore, the photoelectric conversion elements PD of each of the pixel layers 111, 113 and 115 may have a different charge collection time period P. By controlling the charge collection time P of each of the pixel layers 111, 113 and 115, the image sensor 100 may decrease signal attenuation that may occur due to the stacking of the pixel layers 111, 113 and 115.

The control unit 125 may control the respective charge collection time periods P of the photoelectric conversion elements PDs respectively implemented in the pixel layers 111, 113, and 115, as illustrated in FIG. 12.

A charge collection time period (P=P2) of a photoelectric conversion element PD implemented in each of a plurality of rows ROW1 through ROWn of the second pixel layer 113 are longer than a charge collection time period (P=P1) of a photoelectric conversion element PD implemented in each of a plurality of rows ROW1 through ROWk of the first pixel layer 111. A charge collection time period (P=P3) of a photoelectric conversion element PD implemented in each of a plurality of rows ROW1 through ROWm of the third pixel layer 115 are longer than the charge collection time period (P=P2) of the photoelectric conversion element PD implemented in each of the rows ROW1 through ROWn of the second pixel layer 113.

In other words, the respective charge collection time periods P1, P2, and P3 of the photoelectric conversion element PDs respectively implemented in the pixel layers 111,113, and 115 may differ according to the positions of the pixel layers. According to an example embodiment, as a pixel layer is positioned to be relatively lower as compared to other ones of the pixel layers, a charge collection time period of a photoelectric conversion element PD of the pixel layer may increase or decrease.

Figure 13:
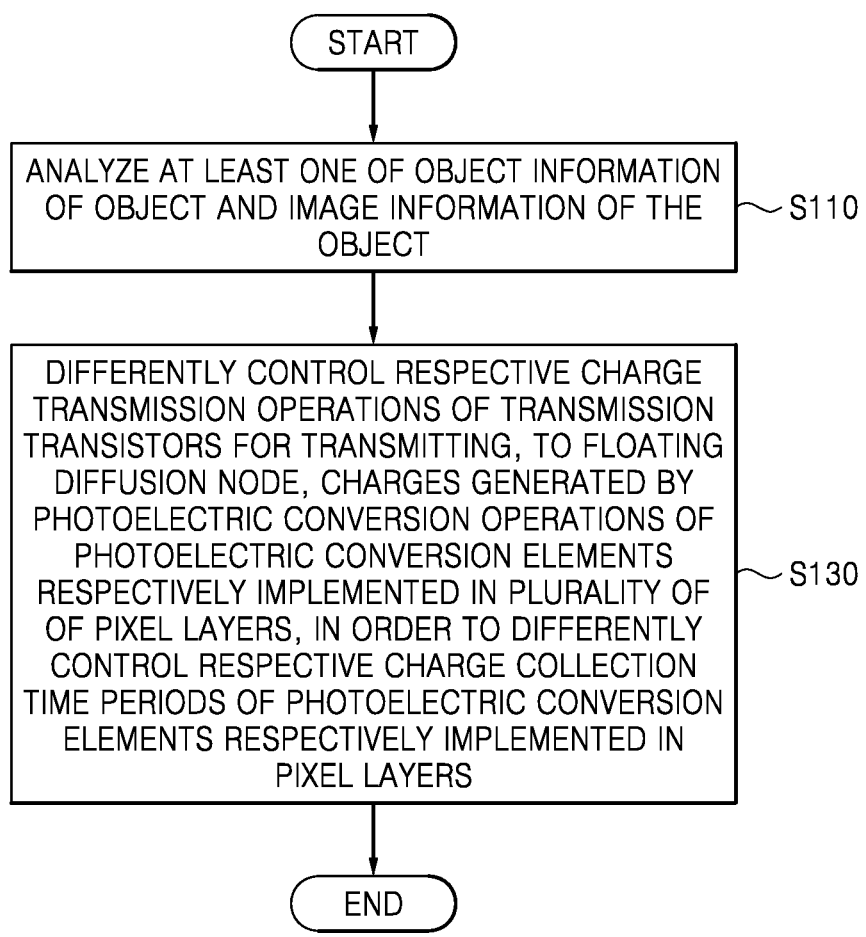
FIG. 13 is a flowchart of the method of operating an image sensor illustrated in FIG. 12.

FIG. 13 is a flowchart of the method of operating the image sensor 100.

Referring to FIGS. 1 through 13, the control unit 125 may analyze at least one of the object information OBI1 and image information IMI of the object 500 generated by the pixel array 110, in operation S110. Alternatively, the control unit 125 may analyze the object information OBI2 of the object 500 generated by the peripheral sensor 600.

In operation S130, the control unit 125 may differently control respective charge transmission operations of the transmission transistors TXs for transmitting charges generated by the photoelectric conversion operations of the photoelectric conversion element PDs respectively implemented in the stacked pixel layers 111,113, and 115 to the floating diffusion node FD, in order to differently control respective charge collection time periods P of the photoelectric conversion elements PDs.

Figure 14:
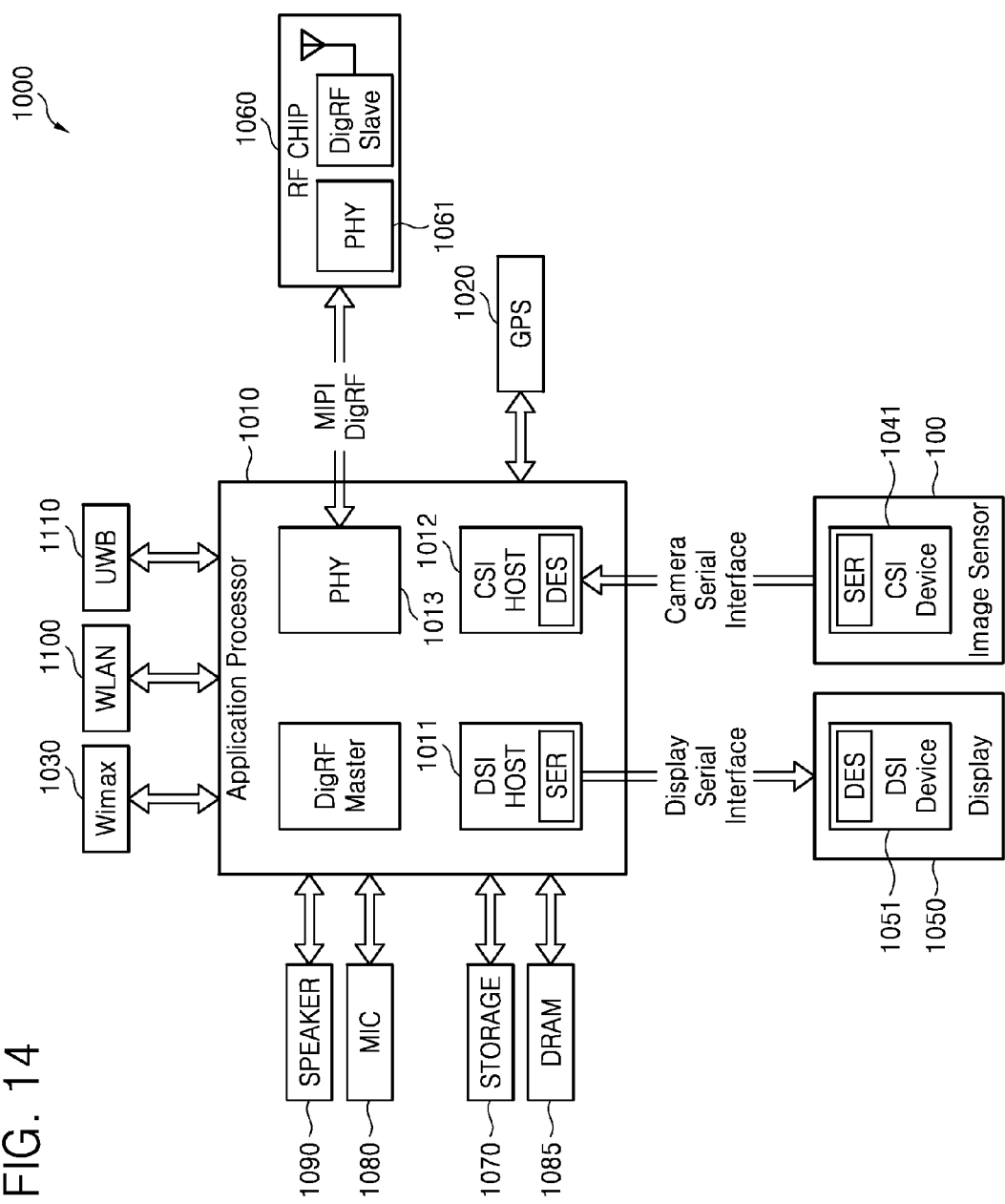
FIG. 14 is a block diagram of an image processing system according to another example embodiment of the inventive concepts.

FIG. 14 is a block diagram of an image processing system 1000 according to another example embodiment of the inventive concepts.

Referring to FIG. 14, the image processing system 1000 may be implemented by an image processing device capable of using or supporting a mobile industry processor interface (MIPI). Examples of the image processing device may include a personal digital assistant (PDA), a portable multimedia player (PMP), an internet protocol television (IPTV), a smart phone, a tablet PC, and a mobile internet device (MID).

The image processing system 1000 includes the image sensor 100, an application processor (AP) 1010, and a display 1050.

A camera serial interface (CSI) host 1012 implemented in the AP 1010 may serially communicate with a CSI device 1041 of the image sensor 100 via a CSI. The CSI host 1012 may include a deserializer (DES) and the CSI device 1041 may include a serializer (SER).

A display serial interface (DSI) host 1011 implemented in the AP 1010 may serially communicate with a DSI device 1051 of the display 1050 via a DSI. The DSI host 1011 may include an SER and the DSI device 1051 may include a DES.

According to an example embodiment, the image processing system 1000 may further include a RF chip 1060 capable of communicating with the AP 1010.

A Physical layer (PHY) 1013 included in the AP 1010 and a PHY 1061 included in the RF chip 1060 may exchange data according to a MIPI DigRF protocol.

According to an example embodiment, the image processing system 1000 may further include a global positioning system (GPS) 1020, a storage 1070, a microphone (MIC) 1080, a dynamic random access memory (DRAM) 1085, and a speaker 1090.

The image processing system 1000 may communicate with an external device by using a world interoperability for microwave access (Wimax) module 1030, a wireless LAN (WLAN) module 1100, and/or an ultra wideband (UWB) module 1110.

Figure 15:
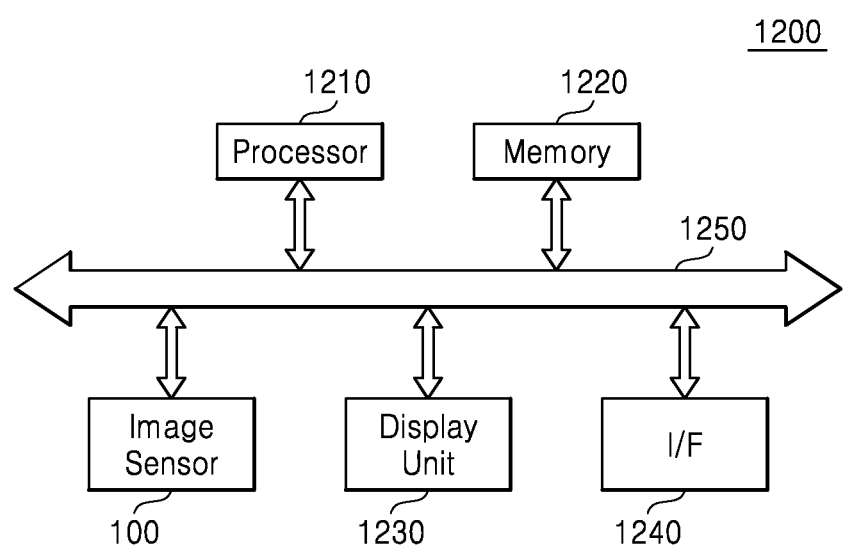
FIG. 15 is a block diagram of an image processing system according to another example embodiment of the inventive concepts.

FIG. 15 is a block diagram of an image processing system 1200 according to another example embodiment of the inventive concepts.

Referring to FIG. 15, the image processing system 1200 may include the image sensor 100, a processor 1210, a memory 1220, a display unit 1230, and an interface (I/F) 1240.

According to an example embodiment, the image processing system 1200 may be implemented by a medical device or a portable electric device. The portable electric device may be implemented by a smart phone, a tablet PC, a personal digital assistant (PDA), an enterprise digital assistant (EDA), a portable multimedia player (PMP), a mobile internet device (MID), or an e-book.

The processor 1210 may control an operation of the image sensor 100, or may process image data output by the image sensor 100. According to an example embodiment, the ISP 200 may be embodied as the processor 1210.

The memory 1220 may store a program for controlling an operation of the image sensor 100 and an image generated by the processor 1210, via the bus 1250 under the control of the processor 1210, and the processor 1210 may access stored information to execute the program. For example, the memory 1220 may be implemented by using a non-volatile memory.

The display unit 1230 may receive an image from the processor 1210 or the memory 1220 and display the image. The I/F 1240 may be implemented using an interface for inputting and outputting a 2-dimensional or a 3-dimensional image. According to an example embodiment, the interface 1240 may be implemented by using a wireless interface.

An image sensor according to an example embodiment of the inventive concepts may prevent signal attenuation from occurring due to stacking of a plurality of pixel layers, by differently controlling respective charge collection time periods of photoelectric conversion elements respectively implemented in the pixel layers.

While the inventive concepts have been particularly shown and described with reference to example embodiments thereof, it will be understood that various changes in form and details may be made therein without departing from the spirit and scope of the following claims.

What is claimed is:

1. An image sensor comprising:
   a plurality of transmission transistors each associated with one of a plurality of stacked pixel layers, the transmission transistors configured to transmit charges to respective floating diffusion nodes during respective charge transmission operations, the charges being generated during respective charge collection time periods by photoelectric conversion elements implemented in corresponding ones of the plurality of stacked pixel layers; and
   a control unit configured to individually control the charge transmission operations of the transmission transistors associated with each of the plurality of stacked pixel layers such that the photoelectric conversion elements implemented in different ones of the plurality of stacked pixel layers have different charge collection time periods.

2. The image sensor of claim 1, wherein each of the plurality of stacked pixel layers include,
   a transmission control line configured to propagate a transmission control signal, the transmission control signal configured to control the charge transmission operation of the transmission transistors in a respective pixel layer among the plurality of stacked pixel layers.

3. The image sensor of claim 1, wherein the charge collection time period of the photoelectric conversion elements is different based on relative positions of the plurality of stacked pixel layers.

4. The image sensor of claim 1, wherein at least one of the plurality of stacked pixel layers comprises:
   a pixel configured to obtain object information of an object, and
   the control unit is configured to analyze the object information and differently control the charge transmission operations of the transmission transistors in the plurality of stacked pixel layers according to a result of the analysis.

5. The image sensor of claim 4, wherein the object information comprises:
   information indicating a movement of the object, and
   the control unit is configured to differently control the charge transmission operations of the transmission transistors in the plurality of stacked pixel layers, if a value of the movement is smaller than a threshold value.

6. The image sensor of claim 4, wherein the object information comprises:
   information indicating a distance between the object and the image sensor, and, wherein
   the control unit is configured to differently control the charge transmission operations of the transmission transistors in the plurality of stacked pixel layers, if a change in the distance is smaller than a threshold value.

7. The image sensor of claim 1, wherein at least one of the plurality of stacked pixel layers comprises:
   a pixel configured to obtain image information of an object, and
   the control unit is configured to analyze the image information and differently control the charge transmission operations of the transmission transistors implemented in the plurality of stacked pixel layers according to a result of the analysis.

8. The image sensor of claim 7, wherein the image information comprises:
   information indicating a change between frames, and
   the control unit is configured to differently control the charge transmission operations of the transmission transistors implemented in the plurality of stacked pixel layers, if the change between frames is smaller than a threshold value.

9. The image sensor of claim 7, wherein the image information comprises:
   information indicating a motion vector of an image of the object, and
   the control unit is configured to differently control the charge transmission operations of the transmission transistors implemented in the plurality of stacked pixel layers, if a value of the motion vector is smaller than a threshold value.

10. An image processing system comprising:
    the image sensor of claim 1; and
    a processor for controlling the image sensor.

11. The image processing system of claim 10, further comprising:
    at least one sensor configured to sense an object and output object information of the object to the control unit, wherein
    the processor is configured to process an image of the object and output image information of a processed image to the control unit,
    the control unit is configured to analyze at least one of the object information and the image information, and
    the control unit is configured to differently control the charge transmission operations of the transmission transistors implemented in the plurality of stacked pixel layers according to a result of the analysis.

12. A portable electric device comprising:
    the image sensor of claim 1;
    a processor that controls the image sensor; and
    a display unit that displays an image based on an output signal of the processor.

13. A method of operating an image sensor including a pixel array having a plurality of stacked pixel layers, the method comprising:
    analyzing information of an object, the information being generated by the pixel array; and
    individually controlling transmission transistors associated with respective ones of the plurality of stacked pixel layers according to a result of the analysis such that the photoelectric conversion elements implemented in different ones of the plurality of stacked pixel layers have different charge collection time periods.

14. The method of claim 13, wherein each of the plurality of stacked pixel layers includes,
    a transmission control line configured to propagate a transmission control signal to the transmission transistors associated with a respective one of the plurality of stacked pixel layers such that the associated transmission transistor transmits charges collected during a respective one of the charge collection time periods to a respective floating diffusion node based on the transmission control signal.

15. The method of claim 13, wherein the charge transmission collection time periods of the photoelectric conversion elements implemented in respective ones of the plurality of stacked pixel layers are different based on a relative position of the plurality of stacked pixel layers.

16. An image sensor comprising:
    a pixel array having a plurality of layers, each of the plurality of layers including pixels having a photoelectric conversion element and a transmission transistor therein, the photoelectric conversion element configured to collect charges during an associated charge collection time period and the transmission transistor configured to transmit the charges to a respective floating diffusion node at an end of the charge collection time period; and
    a control unit configured to individually instruct the transmission transistors associated with different ones of the layers to transmit the charges to the respective floating diffusion nodes such that the charge collection time periods associated with the photoelectric conversion elements implemented in at least two of the layers differs in length.

17. The image sensor of claim 16, wherein the control unit is configured to adjust the charge collection time period of the photoelectric conversion elements of the pixels in the layers based on a position of the layer associated with the pixels in relation to other ones of the layers.

18. The image sensor of claim 16, wherein each of the pixels is configured to output a pixel signal, and the control unit is configured to adjust the charge collection time period of the photoelectric conversion elements of the pixels in the layers based on an attenuation in the pixel signals due to stacking of the layers.

19. The image sensor of claim 16, wherein each of the layers include,
a transmission control line configured to propagate a transmission control signal to the transmission transistors associated with the layer such that the associated transmission transistor transmit the charges to the respective floating diffusion node based on the transmission control signal.

20. The image sensor of claim 16, wherein the image sensor is configured to sense an object, and
the control unit is configured to adjust the charge collection time period if one or more of an amount of movement of the object and a distance between the object and the image sensor is greater than a threshold.

* * * * *